US010690312B2

(12) United States Patent
Mackin (10) Patent No.: US 10,690,312 B2
(45) Date of Patent: Jun. 23, 2020

(54) LIGHT EMITTING DIODE SIGNAL LIGHT (71) Applicant: Tri Lite, Inc., Chicago, IL (US)

(72) Inventor: Michael P. Mackin, Chicago, IL (US)

(73) Assignee: TRI LITE, INC., Chicago, IL (US)

(*) Notice: Subject to any disclaimer, the term of this patent is extended or adjusted under 35 U.S.C. 154(b) by 0 days.

(21) Appl. No.: 15/956,277

(22) Filed: Apr. 18, 2018

(65) Prior Publication Data
US 2018/0335193 A1 Nov. 22, 2018

Related U.S. Application Data (63) Continuation-in-part of application No. 15/599,111, filed on May 18, 2017.

(51) Int. Cl.
F21S 43/00 (2018.01)
F21S 43/243 (2018.01)
(Continued)

(52) U.S. Cl.
CPC ............ F21S 43/243 (2018.01); F21S 43/14 (2018.01); F21S 43/195 (2018.01); F21S 43/241 (2018.01); F21S 43/315 (2018.01); F21S 45/47 (2018.01); G02B 6/0018 (2013.01); G02B 6/0031 (2013.01); G02B 6/0075 (2013.01);
(Continued)

(58) Field of Classification Search
CPC .......... B60Q 7/00; B60Q 1/26; B60Q 1/2611; F21K 9/00; F21K 9/238; F21S 8/03; F21S 43/00; F21S 43/14; F21S 43/241; F21S 43/26; F21S 43/243; F21S 45/47; F21S 43/315; F21S 43/31; F21S 45/48; F21S 43/195; F21V 23/005; F21V 29/70; F21Y 2115/10; G02B 6/0018; G02B 6/0021; G02B 6/0031; G02B 6/0075; H05K 1/00; H05K 1/181; H05K 1/111; H05K 1/0274;
(Continued)

(56) References Cited

U.S. PATENT DOCUMENTS 2,254,961 A 9/1941 Harris
5,608,290 A * 3/1997 Hutchisson .............. B60Q 7/00
315/185 R
(Continued)

OTHER PUBLICATIONS

BBIER Led Manufacturing "LED Stubby Garden Lights With Cover," Available online at least as early as Jun. 30, 2015 (http://www.ledbbier.com/25wledgardenlightwithcover104.html), 38 pages.
(Continued)

Primary Examiner — Y M. Quach Lee
(74) Attorney, Agent, or Firm — Michael Best & Friedrich LLP (57) ABSTRACT An LED signal light includes, in one embodiment, a printed circuit board, an LED light source, and electronic control circuitry. The printed circuit board includes a substrate layer and a metal layer. The metal layer is adjacent to the substrate layer. The metal layer includes a first pad and a second pad spaced apart from the first pad in a radial direction to thermally isolate the second pad from the first pad. The LED light source electrically coupled to the second pad. The electronic control circuitry is electrically coupled to the first pad. The electronic control circuitry is configured to supply electrical energy to the LED light source.

22 Claims, 11 Drawing Sheets (51) Int. Cl.
| | |
|---|---|
| *H05K 1/18* | (2006.01) |
| *H05K 1/02* | (2006.01) |
| *F21S 43/14* | (2018.01) |
| *F21V 8/00* | (2006.01) |
| *F21S 43/19* | (2018.01) |
| *F21S 43/241* | (2018.01) |
| *H05K 1/11* | (2006.01) |
| *F21S 45/47* | (2018.01) |
| *F21S 43/31* | (2018.01) |
| *F21Y 115/10* | (2016.01) |

(52) U.S. Cl.
CPC ........... *H05K 1/0274* (2013.01); *H05K 1/111* (2013.01); *H05K 1/181* (2013.01); *F21Y 2115/10* (2016.08)

(58) Field of Classification Search
CPC ........... H05K 1/0203; H05K 2201/066; H05K 2201/10106
See application file for complete search history.

(56) References Cited

U.S. PATENT DOCUMENTS

| | | | | |
|---|---|---|---|---|
| 6,086,218 | A * | 7/2000 | Robertson | F21L 4/027 340/815.73 |
| 7,079,041 | B2 * | 7/2006 | Fredericks | B64D 47/06 340/321 |
| 7,160,010 | B1 | 1/2007 | Chinniah et al. | |
| 7,300,173 | B2 | 11/2007 | Catalano et al. | |
| 7,438,454 | B2 | 10/2008 | Chinniah et al. | |
| 7,461,960 | B2 | 12/2008 | Opolka et al. | |
| 7,524,091 | B2 | 4/2009 | King | |
| 7,566,138 | B2 * | 7/2009 | Inoue | G01D 11/28 362/23.12 |
| 7,637,639 | B2 | 12/2009 | Epstein | |
| 7,712,927 | B2 | 5/2010 | Shuai et al. | |
| 7,794,118 | B2 | 9/2010 | Huang et al. | |
| 7,926,964 | B2 | 4/2011 | Claprood | |
| 8,001,408 | B2 | 8/2011 | Hu | |
| 8,083,375 | B2 | 12/2011 | Kong | |
| 8,227,960 | B2 | 7/2012 | Huang | |
| 8,283,844 | B2 | 10/2012 | Cho et al. | |
| 8,294,339 | B2 | 10/2012 | Lin et al. | |
| 8,547,003 | B2 | 10/2013 | Wu | |
| 8,632,223 | B2 | 1/2014 | McDermott | |
| 8,651,705 | B2 | 2/2014 | Wilcox et al. | |
| 8,783,885 | B2 | 7/2014 | Kretschmann et al. | |
| 8,858,022 | B2 | 10/2014 | Jiang et al. | |
| 8,911,118 | B2 | 12/2014 | Zhang et al. | |
| 8,933,645 | B2 | 1/2015 | Nishigaki | |
| 8,960,967 | B2 * | 2/2015 | Harwood | F21S 2/00 362/246 |
| 9,052,417 | B2 | 6/2015 | Ticktin | |
| 9,076,419 | B2 | 7/2015 | McMillen et al. | |
| 9,894,767 | B1 | 2/2018 | Krugman | |
| 2004/0057234 | A1 * | 3/2004 | Mohacsi | B63B 45/04 362/231 |
| 2005/0024744 | A1 * | 2/2005 | Falicoff | G02B 3/04 359/737 |
| 2005/0068777 | A1 * | 3/2005 | Popovic | B60Q 1/2611 362/307 |
| 2005/0239227 | A1 * | 10/2005 | Aanegola | H01L 33/52 438/26 |
| 2009/0046456 | A1 * | 2/2009 | Urano | F21K 9/00 362/235 |
| 2011/0215345 | A1 | 9/2011 | Tarsa et al. | |
| 2012/0086024 | A1 * | 4/2012 | Andrews | H01L 25/0753 257/88 |
| 2012/0140517 | A1 * | 6/2012 | Sakamoto | G02B 6/0036 362/607 |
| 2012/0147621 | A1 | 6/2012 | Holten et al. | |
| 2013/0194802 | A1 | 8/2013 | Kim et al. | |
| 2014/0016324 | A1 * | 1/2014 | Hsin | F21V 23/005 362/293 |
| 2014/0049951 | A1 | 2/2014 | Ariyoshi | |
| 2014/0218932 | A1 | 8/2014 | Huang | |
| 2015/0036373 | A1 | 2/2015 | Chen | |
| 2015/0138780 | A1 | 5/2015 | Yoshizawa et al. | |
| 2016/0116140 | A1 * | 4/2016 | Eguchi | H01L 25/0753 362/293 |
| 2016/0181480 | A1 * | 6/2016 | Cumpston | H01L 33/20 257/98 |

OTHER PUBLICATIONS

Robert Donovan, "Bike light LED retrofit," published online Sep. 10, 2008 (http://www.robertsdonovan.com/?p=108), 4 pages.

Office Action issued from the US Patent Office for U.S. Appl. No. 15/599,111 dated Sep. 11, 2018 (12 pages).

* cited by examiner

LIGHT EMITTING DIODE SIGNAL LIGHT

CROSS-REFERENCE TO RELATED APPLICATIONS

This patent application is a continuation-in-part of U.S. patent application Ser. No. 15/599,111, filed May 18, 2017, entitled, "LIGHT EMITTING DIODE SIGNAL LIGHT" the disclosure of which is incorporated herein, in its entirety, by reference.

BACKGROUND

The light emitting diode (LED) signal lights as described below replace flashtube or electric arc type signal lights in applications such as emergency signal lights mounted on motor vehicles.

For years, signal lights (for example, strobe lights) have used flashtube or electric arc type light sources. In recent years, flashtube, electric arc type, and incandescent light sources have been replaced by LED light sources. LED light sources have several advantages over flashtube, electrical arc type, and incandescent light sources. LED light sources are smaller, are more energy efficient, and have a longer cycle life. However, replacing flashtube, electrical arc type, and incandescent light sources with LED light sources presents several challenges.

For example, the dispersal of light emitted from a flashtube light source is wider than an LED light source. LED light sources emit a narrow dispersal of light. In applications such as emergency signal lights, a wide dispersal of light is preferred. Current LED signal lights achieve wide light dispersals by arranging LED light sources to point in different directions away from a central point. However, a large number of LED light sources are required to provide light emission in all directions.

Another advantage of LED light sources is that they produce less heat than flashtube, electric arc type, and incandescent light sources. However, the amount of heat produced by LED light sources is still significant, particularly when a large number of LED light sources are needed. In view of the heat produced by LED light sources, current LED signal lights house their LED light sources on a printed circuit board (PCB) that is physically separated from a PCB which houses the rest of the control electronics. Housing the LED light sources and the control electronics on separate PCBs increases the overall footprint or bulk of the signal light.

SUMMARY

In one embodiment, an LED signal light includes a printed circuit board, an LED light source, and electronic control circuitry. The printed circuit board includes a substrate layer and a metal layer. The metal layer is adjacent to the substrate layer. The metal layer includes a first pad and a second pad spaced apart from the first pad in a radial direction to thermally isolate the second pad from the first pad. The LED light source is electrically coupled to the second pad, and the electronic control circuitry is electrically coupled to the first pad. The electronic control circuitry is configured to supply electrical energy to the LED light source.

In another embodiment, an LED signal light includes an LED light source and a light guide. The LED light source is configured to emit light along an axial light emission axis. The light guide includes a concave surface that reflects, and a plurality of radially extending transmission arms that direct, the light emitted from the LED light source along at least one substantially radial light emission axis.

In yet another embodiment, an LED signal light includes a base, the printed circuit board, the LED light source, the electronic control circuitry, and a light guide. The printed circuit board and the light guide are disposed on the base. The light guide includes a plurality of fins and a concave surface.

Other aspects of the LED signal light will become apparent by consideration of the detailed description and accompanying drawings.

DETAILED DESCRIPTION

Before any embodiments of the LED signal light are explained in detail, it is to be understood that the LED signal light is not limited in its application to the details of construction and the arrangement of components set forth in the following description or illustrated in the following drawings. The LED signal light is capable of other embodiments and of being practiced or of being carried out in various ways.

It should also be noted that a plurality of different structural components may be utilized to implement the disclosure. Furthermore, and as described in subsequent paragraphs, the specific configurations illustrated in the drawings are intended to exemplify embodiments of the disclosure. Alternative configurations are possible.

Figure 1:
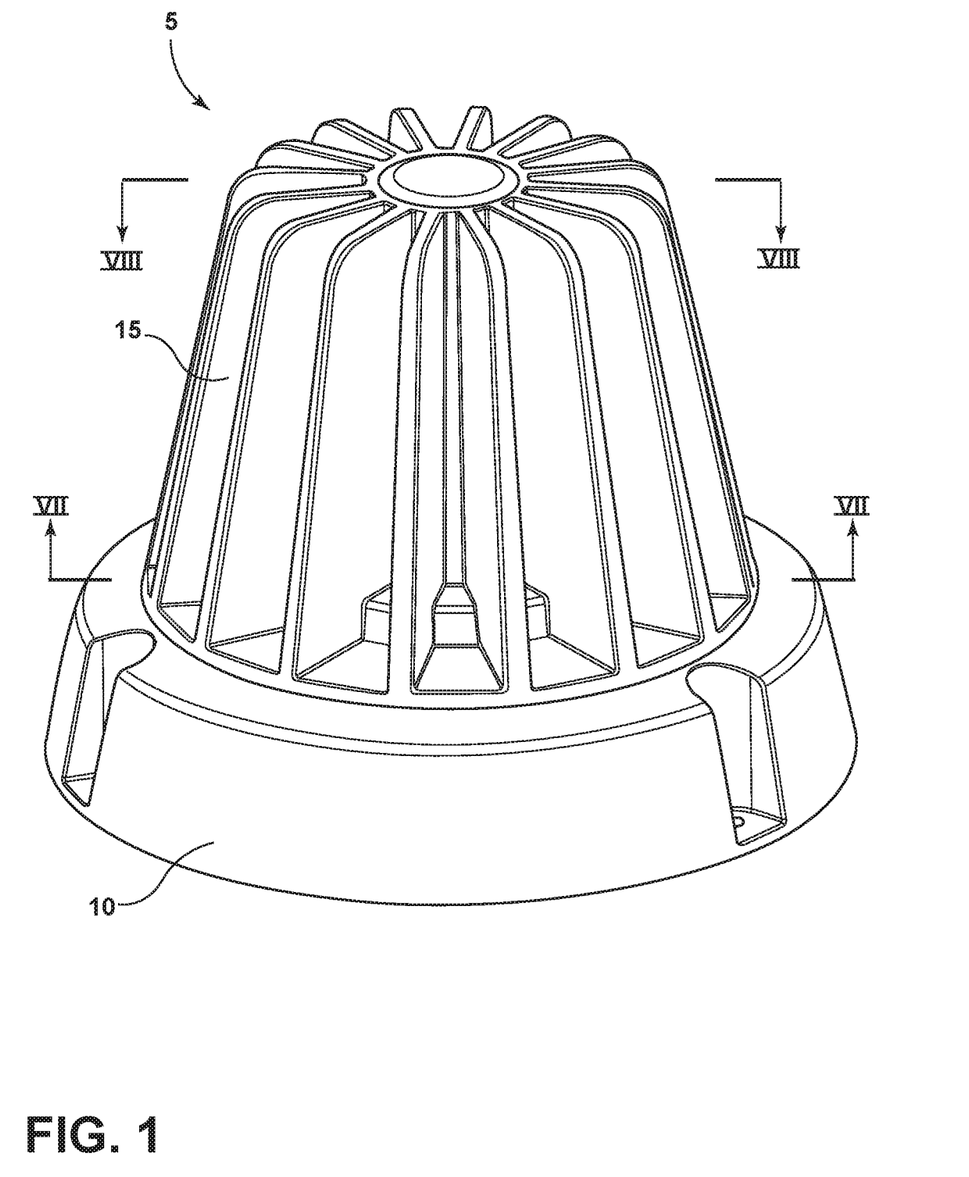
FIG. 1 is a perspective view an LED signal light, in accordance with some embodiments.
Figure 2:
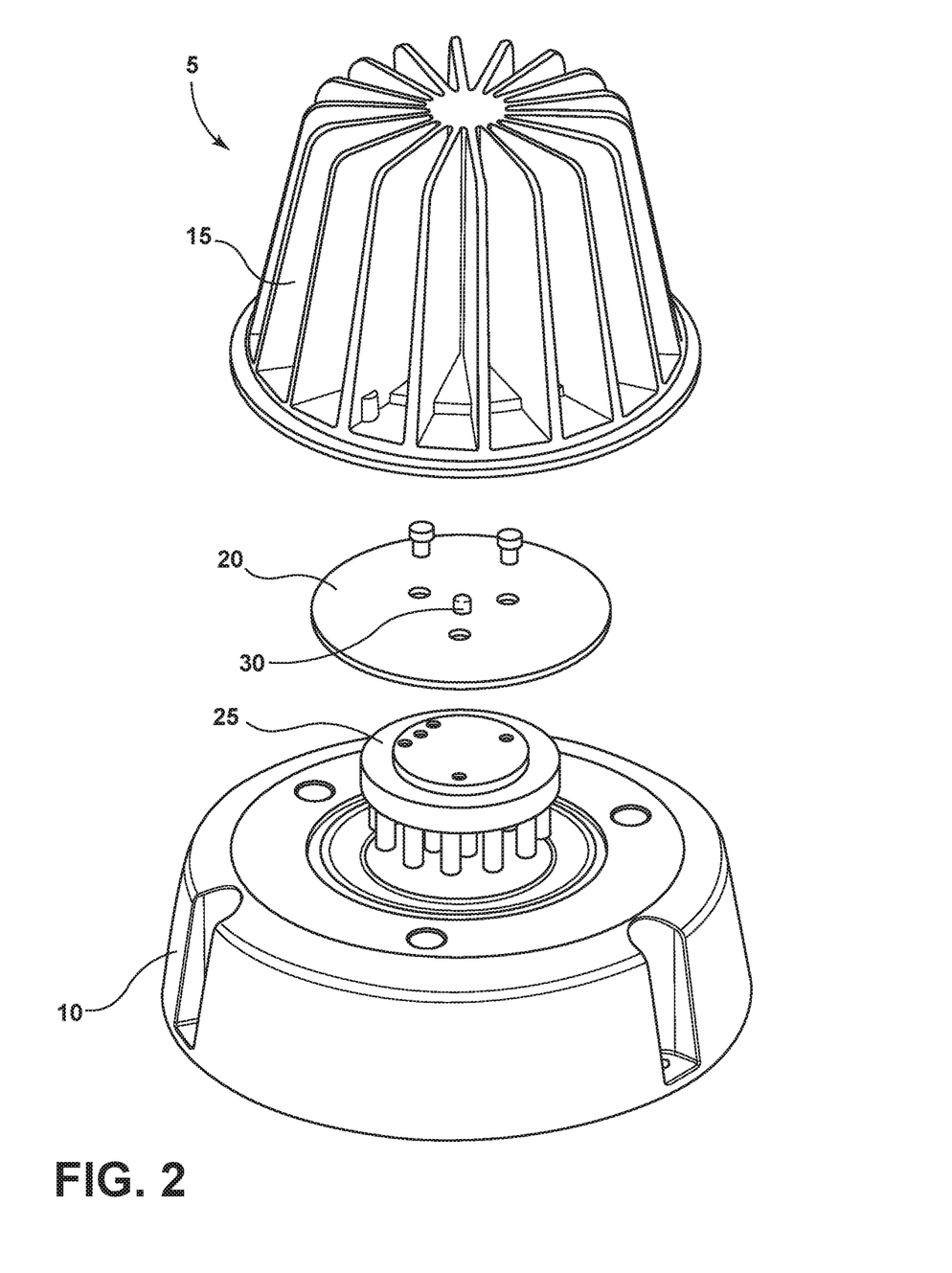
FIG. 2 is an exploded view of the LED signal light in FIG. 1.

FIG. 1 illustrates an exemplary embodiment of a LED signal light 5, which can be used as a strobe light. The LED signal light 5 includes a base 10 and a light guide 15. Referring to FIG. 2, the LED signal light 5 also includes a printed circuit board (or PCB 20), a heat sink 25, and an LED light source 30. The LED light source 30 is housed on the PCB 20, approximately in its center. The base 10 mounts the LED signal light 5 to an underlying surface such as an exterior surface of an emergency vehicle. The base 10 also houses the heat sink 25 and supports the other components of the LED signal light 5.

Figure 3:
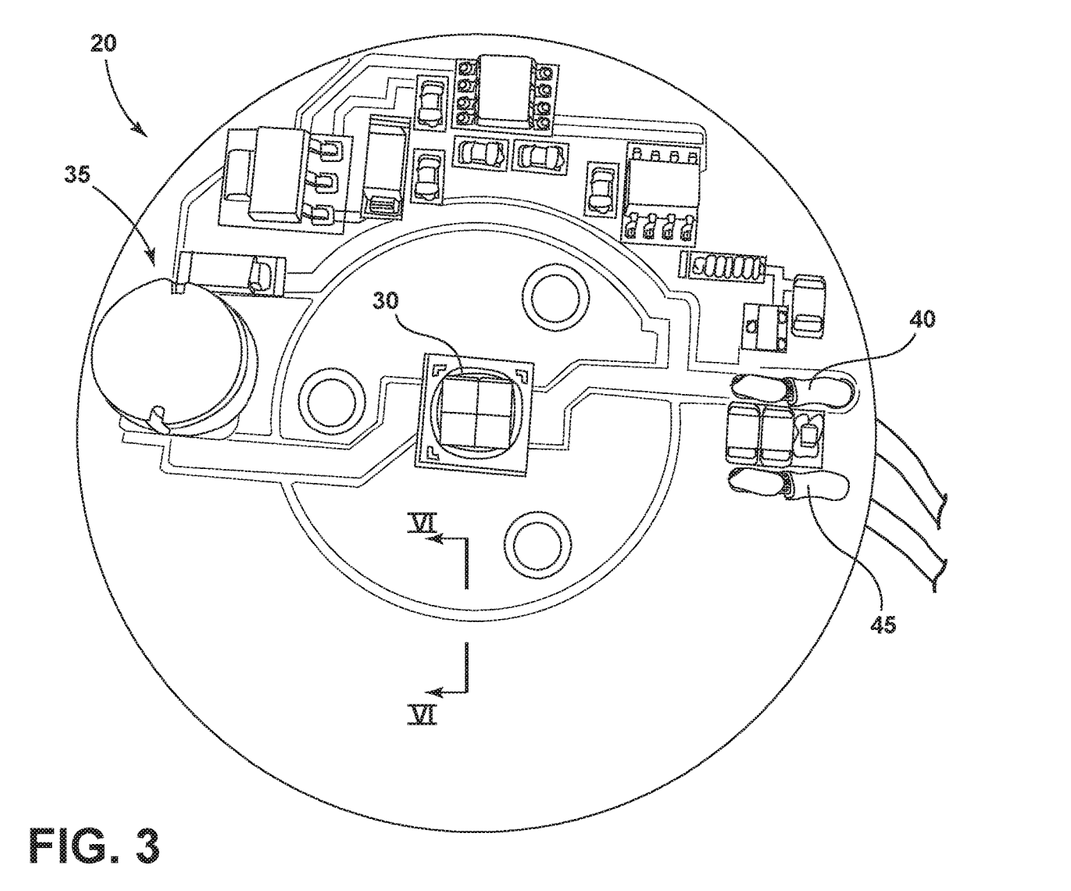
FIG. 3 is a top view of a printed circuit board included in the LED signal light in FIG. 1.

FIG. 3 illustrates an exemplary embodiment of the PCB 20. In the embodiment illustrated in FIG. 3, the LED light source 30 includes four LEDs. In other embodiments, the LED light source 30 includes more or less than four LEDs. Also, in the embodiment illustrated in FIG. 3, the four LEDs of the LED light source 30 are all included on a single chip (for example, a Luxeon M-LXR7-SW57). In other embodiments, the LEDs of the LED light source 30 are housed on separate chips. For example, the LED light source 30 can include four separate LED chips each having one LED. All of the LEDs included in the LED light source 30 face the same direction. In some embodiments, the color temperature of the LED light source 30 is between 5,000 kelvins and 6,500 kelvins.

The PCB 20 illustrated in FIG. 3 also includes electronic control circuitry 35. The electronic control circuitry 35 includes a plurality of passive and active electrical components such as resistors, capacitors, inductors, integrated circuits, amplifiers, voltage regulators, and LED driver circuits. The components of the electronic control circuitry 35 are arranged and connected to provide control functions such as turning the LED light source 30 ON and OFF by selectively supplying electrical energy to the LED light source 30. The LED light source 30 emits light (i.e., the LED light source 30 is ON) when the electronic control circuitry 35 supplies electrical energy to the LED light source 30. Conversely, the LED light source 30 does not emit light (i.e., the LED light source 30 is OFF) when the electronic control circuitry 35 prohibits the LED light source 30 from receiving electrical energy. In some embodiments, the electronic control circuitry 35 supplies electrical energy to the LED light source 30 in timed pulses such that the LED light source 30 strobes. In some embodiments, the electronic control circuitry 35 supplies a current greater than 500 milliamps to the LED light source 30. In addition, the electronic control circuitry 35 provide various electrical functions to the LED light source 30 including, among other things, filtering, signal conditioning, voltage regulation, or a combination thereof.

In the embodiment illustrated in FIG. 3, the electronic control circuitry 35 supplies electrical energy from an external power source via two power leads 40 and 45. In some embodiments, the external power source includes mains power having a voltage between 110 Volts and 240 Volts, with a frequency between 50 Hertz and 60 Hertz. In other embodiments, the external power source includes one or more batteries or battery packs.

Figure 4:
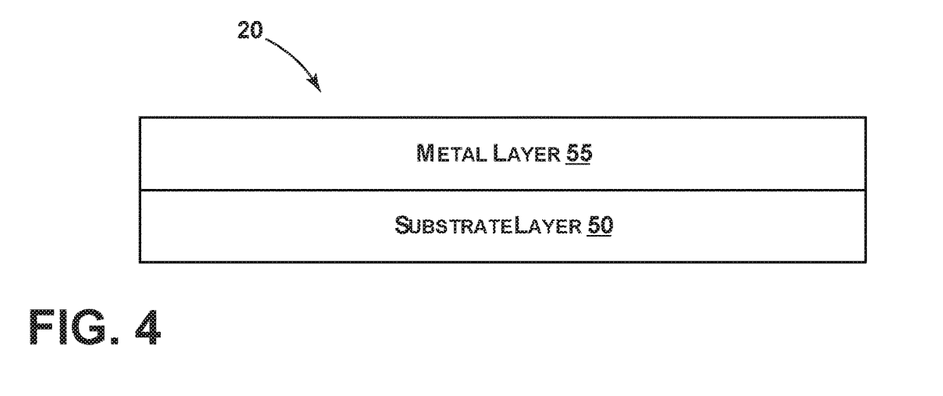
FIG. 4 is a side view of a substrate layer and a metal layer included in the printed circuit board in FIG. 3.

FIG. 4 illustrates a side view of an exemplary embodiment of the PCB 20. The PCB 20 includes a substrate layer 50 and a metal layer 55. In some embodiments, the substrate layer 50 comprises a composite material composed of woven fiberglass cloth with an epoxy resin binder (for example, FR-4). In other embodiments, the substrate layer 50 comprises a composite material composed of woven glass fabric surfaces and a non-woven glass core combined with an epoxy synthetic resin (for example, CEM-3). The metal layer 55 comprises an electrically conductive material such as copper. In some embodiments, as illustrated in FIG. 4, the PCB 20 is single sided. In other words, the PCB 20 includes only one conductive layer (for example, the metal layer 55) and a substrate.

Figure 5:
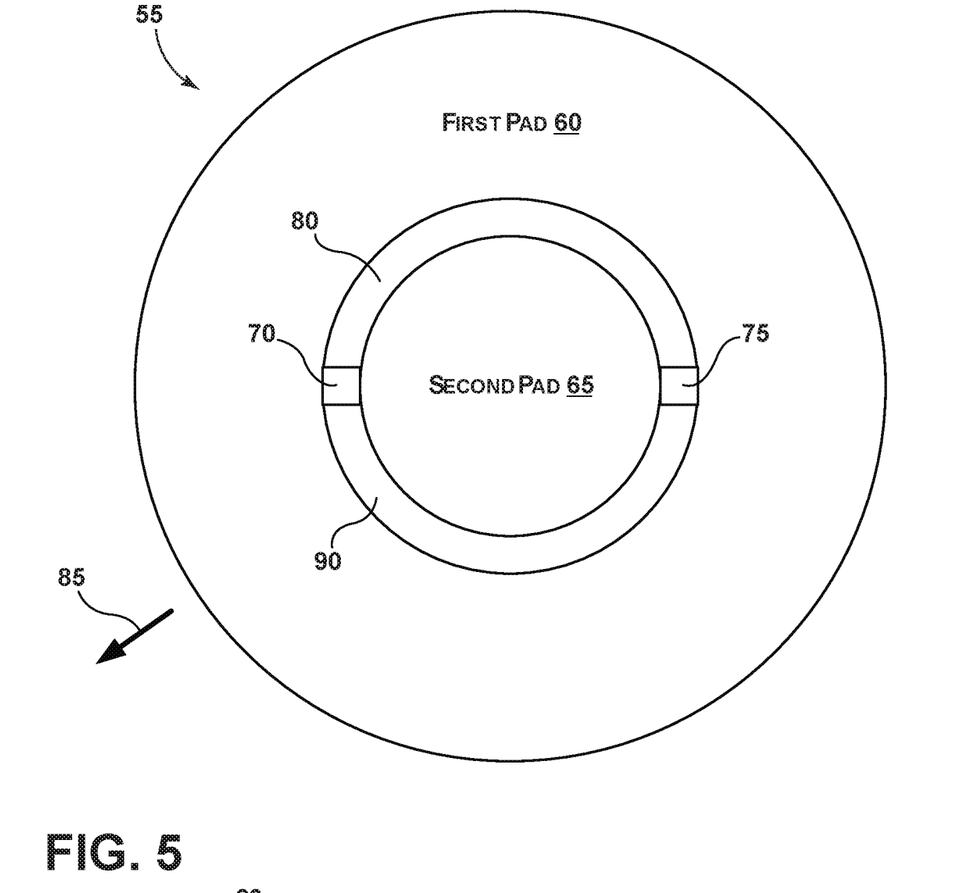
FIG. 5 is a top view of a metal layer included in the printed circuit board in FIG. 3.

FIG. 5 illustrates a top view of an exemplary embodiment of the metal layer 55. The metal layer 55 includes a first pad 60, a second pad 65, and two conductive paths 70 and 75. The electronic control circuitry 35 is electrically coupled to the first pad 60. The LED light source 30 is electrically coupled to the second pad 65. The two conductive paths 70 and 75 electrically couple the first pad 60 and the second pad 65.

Figure 6:
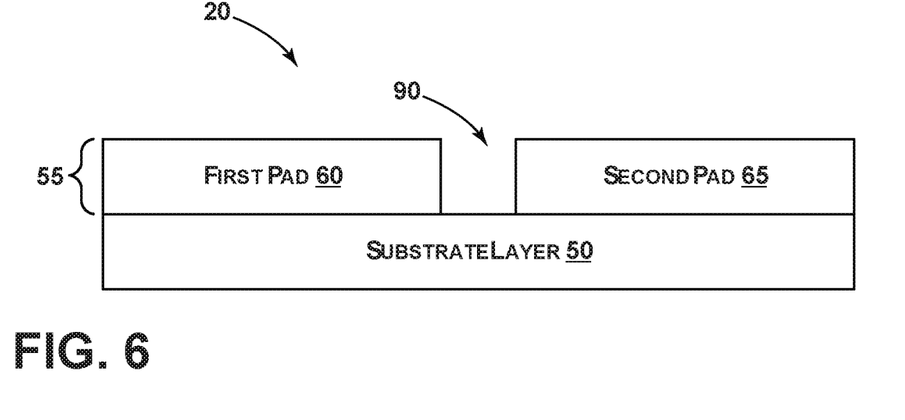
FIG. 6 is a partial section view of the printed circuit board in FIG. 3 taken at line 6-6'.

The first pad 60 includes a hole 80 that is larger than the second pad 65. The second pad 65 is positioned within the hole 80 such that perimeter of the second pad 65 is substantially surrounded by the first pad 60. The first pad 60 and the second pad 65 are spaced apart from each other in a radial direction (for example, direction 85) to form a thermal break 90 (or moat). The thermal break 90 is sufficiently wide enough such that the perimeter of the second pad 65 is thermally isolated from the first pad 60. The thermal break 90 extends around the majority of the second pad 65 except for the two conductive paths 70 and 75. FIG. 6 illustrates a section view of the PCB 20 including the thermal break 90 (taken at line 6-6' in FIG. 3). The metal layer 55 sits atop the substrate layer 50. The thermal break 90 is above the substrate layer 50 and between the first pad 60 and the second pad 65 of the metal layer 55.

The thermal break 90 allows the PCB 20 to house both the LED light source 30 and the electronic control circuitry 35 without affecting the condition or operation of the electronic control circuitry 35. Specifically, the thermal break 90 limits the exposure of the electronic control circuitry 35 to heat produced by the LED light source 30. Housing both the LED light source 30 and the electronic control circuitry 35 on a single PCB achieves a smaller footprint (or bulk) of the LED signal light 5 than constructions having separate PCBs for the LED light source 30 and the electronic control circuitry 35.

Figure 7:
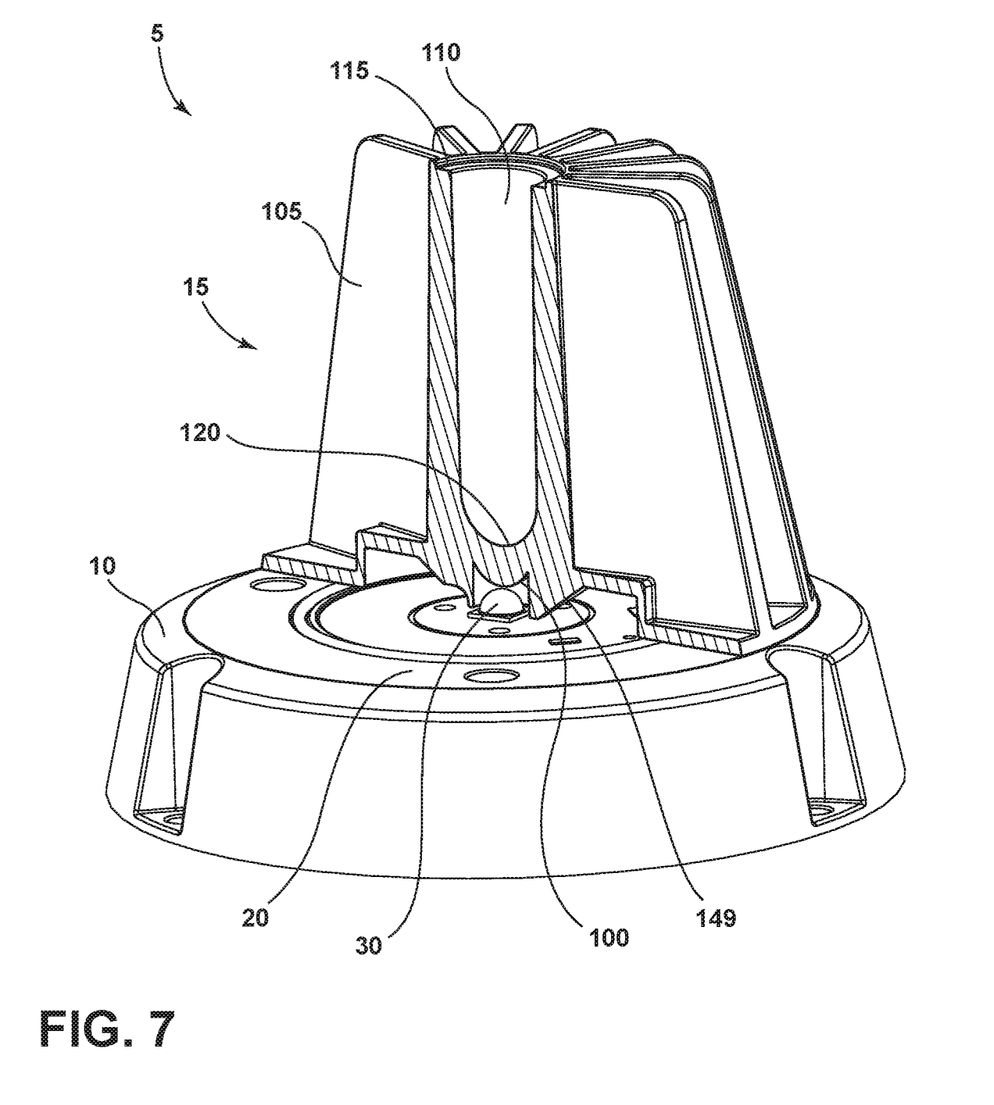
FIG. 7 is a partial section view of a light guide included in the LED signal light in FIG. 1 taken at line 7-7'.
Figure 8:
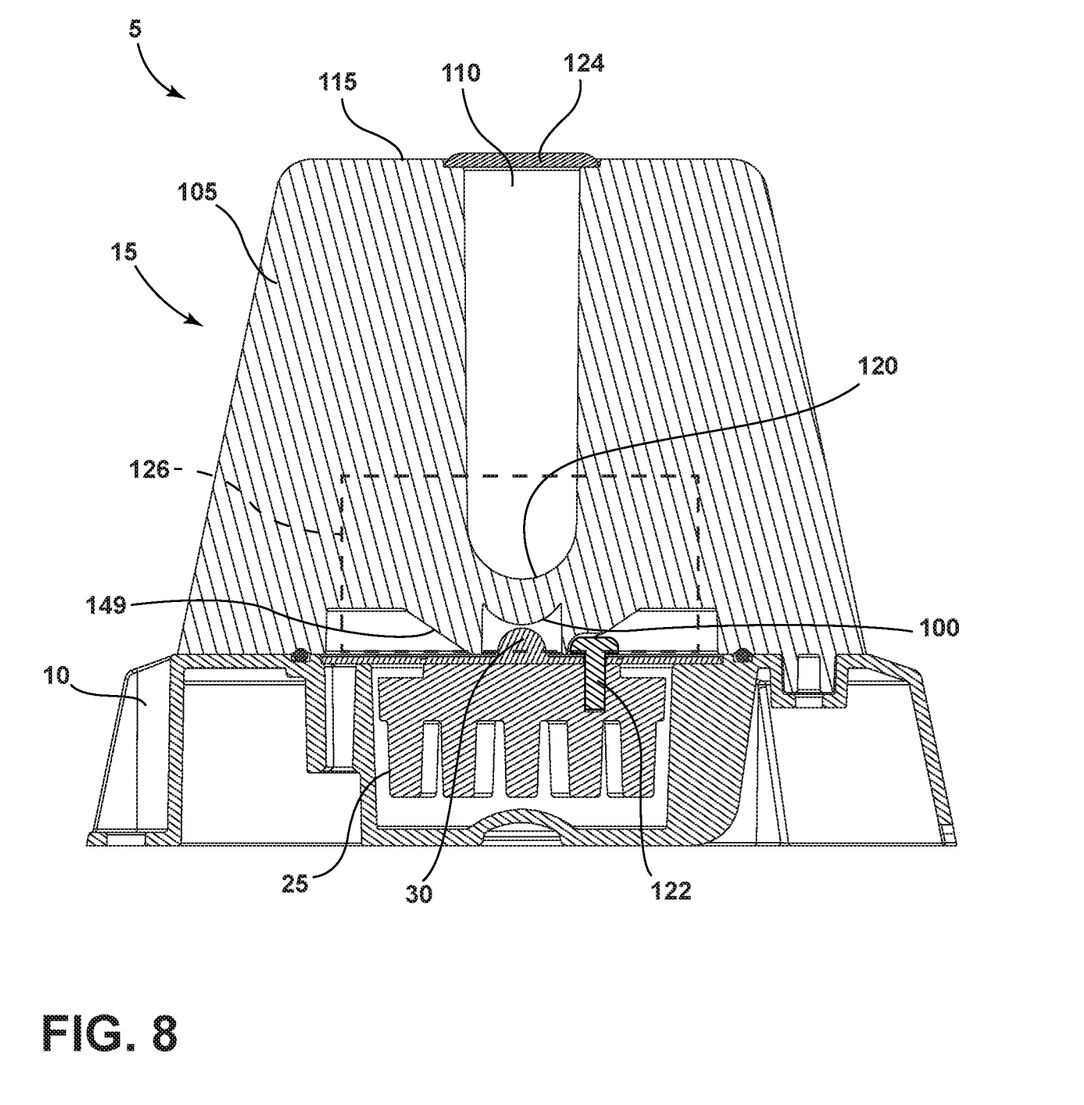
FIG. 8 is a section view of the LED signal light in FIG. 1 taken at line 8-8'.
Figure 9:
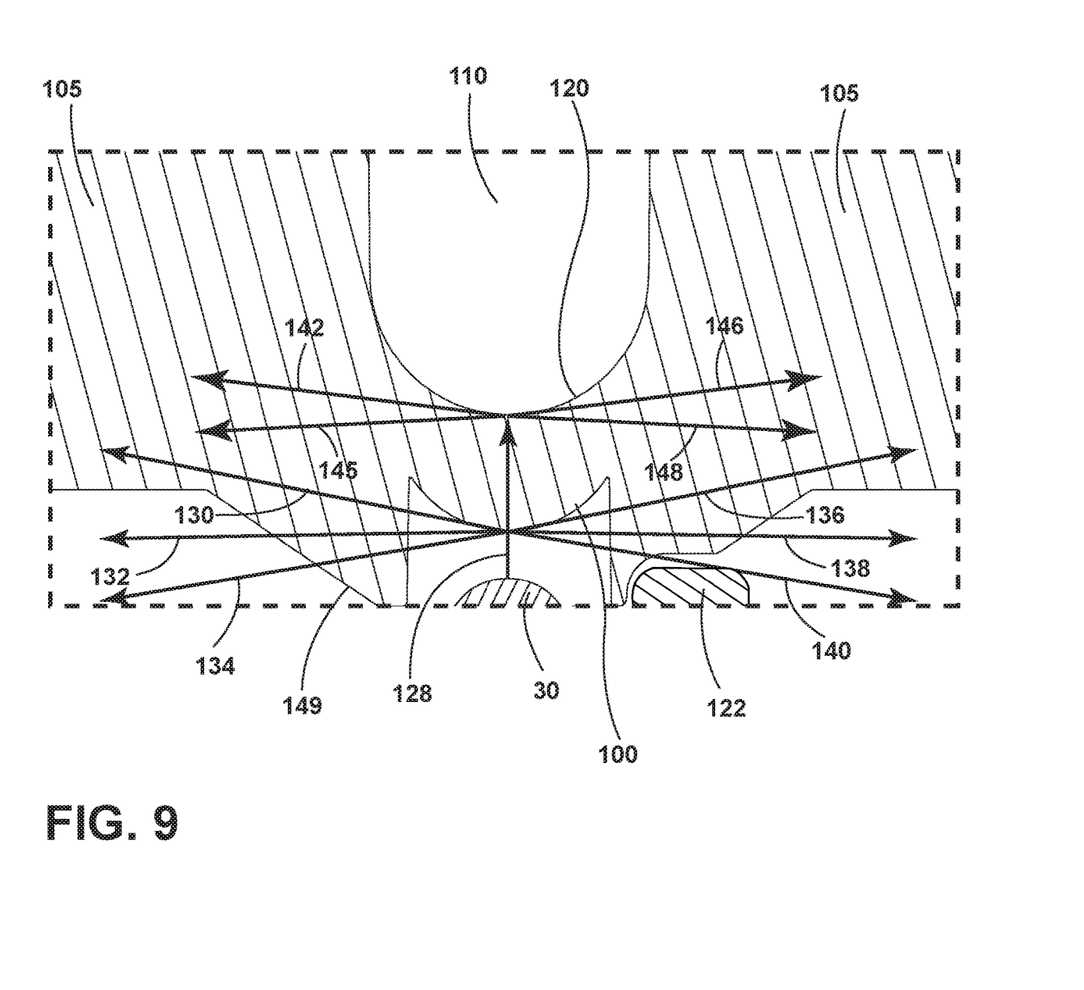
FIG. 9 is an enlarged view of a portion of FIG. 8.

FIGS. 7-9 illustrate an exemplary embodiment of the light guide 15. The light guide 15 includes a first concave surface 100 axially above the LED light source 30. The light guide 15 also includes a plurality of substantially planar light transmission arms or fins 105. The fins 105 radially extend away from a hollow channel or tube 110 and act as light guides for the light emitted by the LED light source 30. The tube 110 extends from a top 115 of the light guide 15 in a direction axially toward the LED light source 30. The tube 110 terminates in a second concave surface 120 axially above the LED light source 30 and above the first concave surface 100. The first concave surface 100 is between the second concave surface 120 and the LED light source 30. The first concave surface 100 and the second concave surface 120 are axially spaced apart but sufficiently close to the LED light source 30 to receive substantial illumination from the LED light source 30. In addition, the second concave surface 120 is parallel to the first concave surface 100.

The LED light source 30 emits light along an axial (or vertical) light emission axis 128 toward the light guide 15. The light guide 15 reflects the light emitted by the LED light source 30 along substantially radial (or horizontal) light emission axes 130, 132, 134, 136, 138, 140, 142, 144, 146, and 148. In particular, the first concave surface 100 reflects a first portion of the light emitted from the LED light source 30 along substantially radial light emission axes 130, 132, 134, 136, 138, and 140. The second concave surface 120 reflects a second portion of the light emitted from the LED light source 30 along substantially radial light emission axes 142, 144, 146, and 148. A portion 149 of the bottom of the light guide 15 has a frustoconical shape and surrounds the LED light source 30 and the first concave surface 100 to provide efficient transmission of light to the fins 105. The fins 105 direct the light along the substantially radial light emission axes 130, 132, 134, 136, 138, 140, 142, 144, 146, and 148. By reflecting the light emitted from the LED light source 30 along substantially radial light emission axes 130, 132, 134, 136, 138, 140, 142, 144, 146, and 148, the LED signal light 5 achieves a wide dispersal of light with a small number of LEDs.

Figure 10:
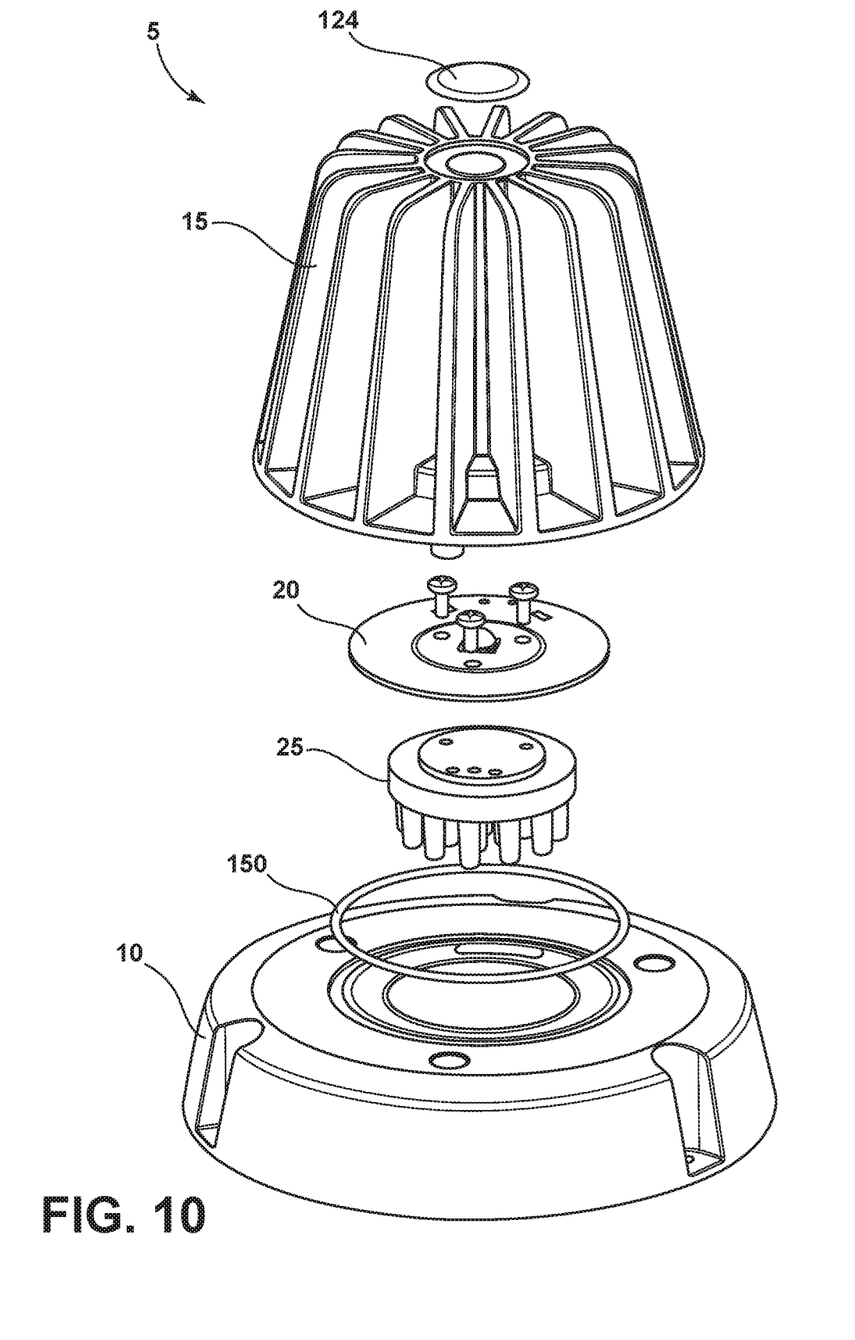
FIG. 10 is an exploded view of the LED signal light in FIG. 1.
Figure 11:
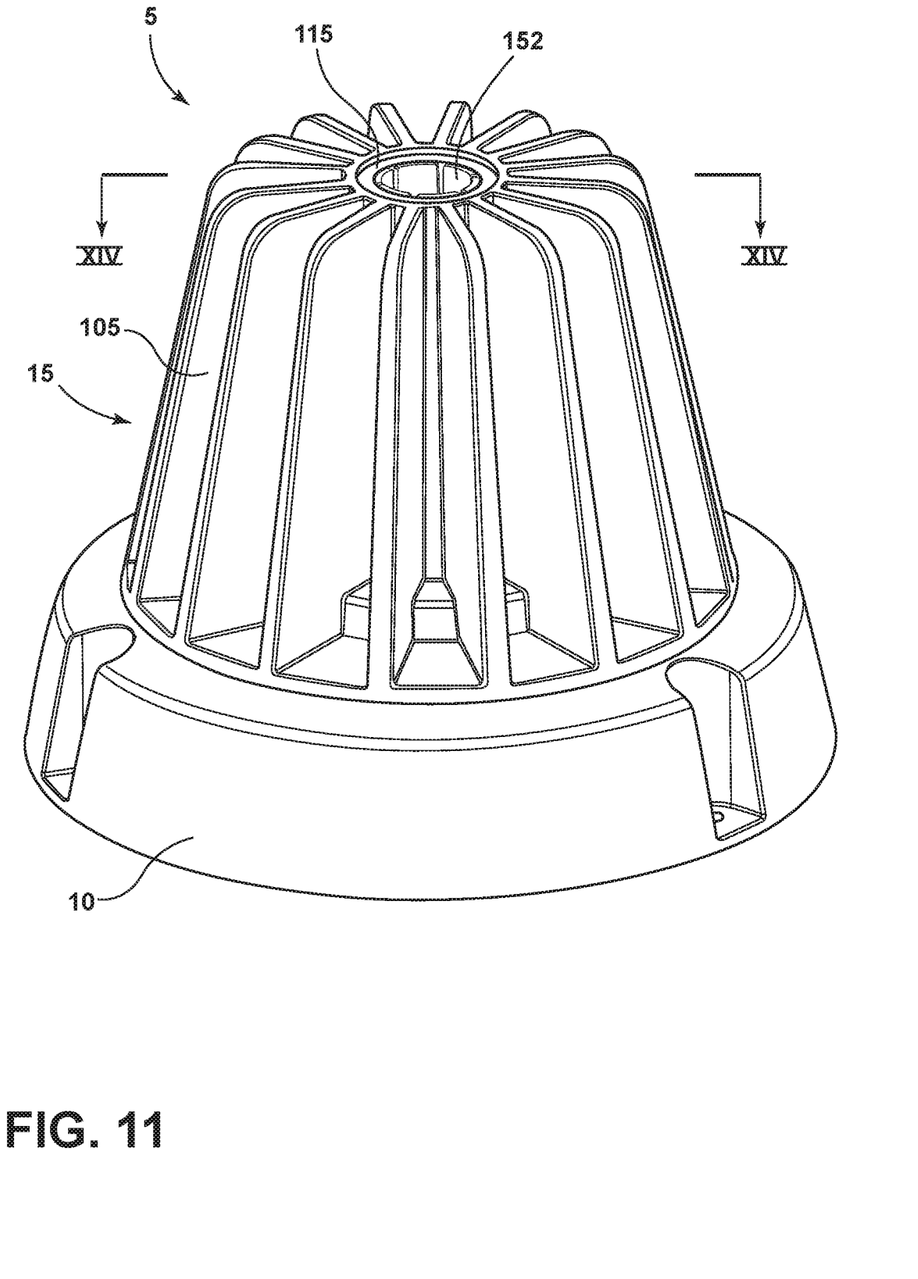
FIG. 11 is a perspective view an LED signal light, in accordance with some embodiments.
Figure 12:
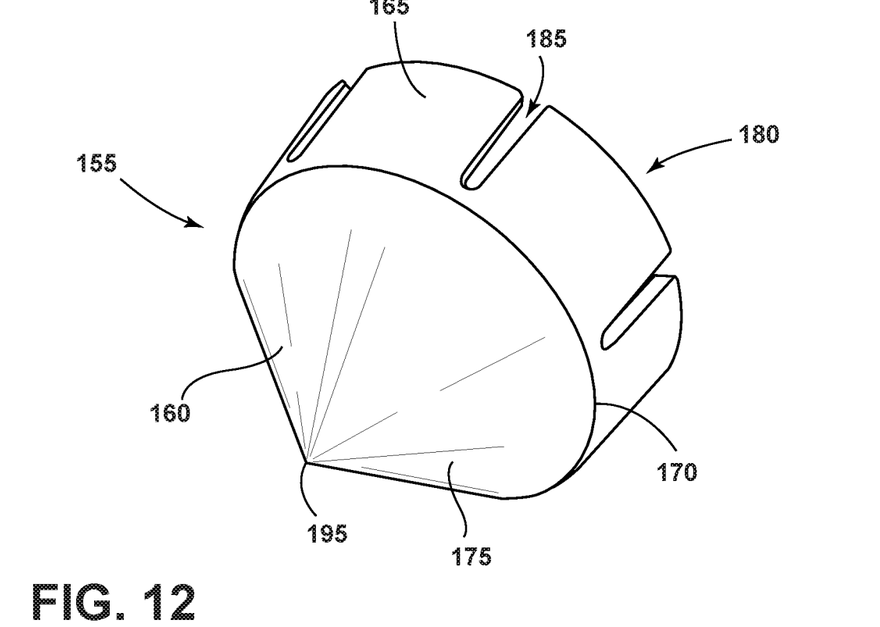
FIGS. 12 and 13 are perspective views of a conical reflecting component included in the LED signal light of FIG. 11.
Figure 13:
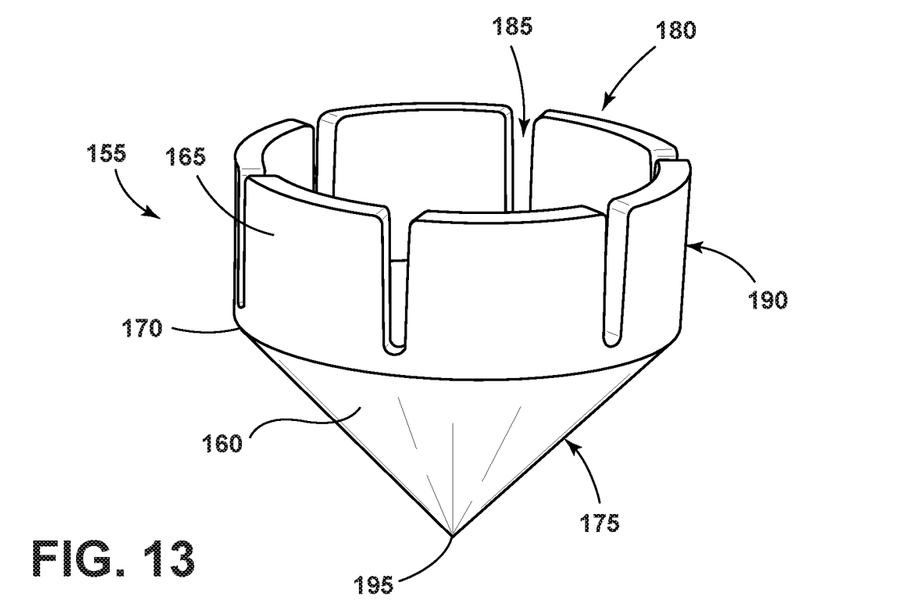

As shown in FIGS. 8 and 10, the heat sink 25 is thermally coupled to the second pad 65 of the PCB 20 via one or more coupling elements 122. In some embodiments, the coupling elements 122 comprise a material such as steel. The heat sink 25 dissipates the heat generated by the LED light source 30. In some embodiments, a cap 124 covers an open end of the tube 110 near the top 115 of the light guide 15. In some embodiments, the LED signal light 5 includes a gasket 150 surrounding the circumference of the PCB 20 as illustrated in FIG. 9. The gasket 150 provides a water tight seal around the PCB 20.

In some embodiments, the LED signal light 5 includes a conical reflecting component 155 positioned within the tube 110 proximate to the top 115 of the light guide 15, as shown in FIGS. 11-14. The conical reflecting component 155 includes a cone 160 and a mounting component 165. The cone 160 defines a base 170 and a conical surface 175 composed of a reflective material that reflects light emitted by the LED light source 30. In some embodiments, the conical reflecting component 155 is formed from plastic, and the conical surface 175 is coated by a light reflective material. For example, the conical surface 175 may be coated (or plated) with one or more layers of aluminum. The mounting component 165 also includes a plurality of tabs 180 extending axially from and around the base 170 of the cone 160. Each of the tabs 180 are separated from adjacent tabs 180 by slots 185, and the tabs 180 include an outer surface 190 configured to frictionally engage the inside of tube 110 to maintain a fixed position of the conical reflecting component 155 in the tube 110.

Figure 14:
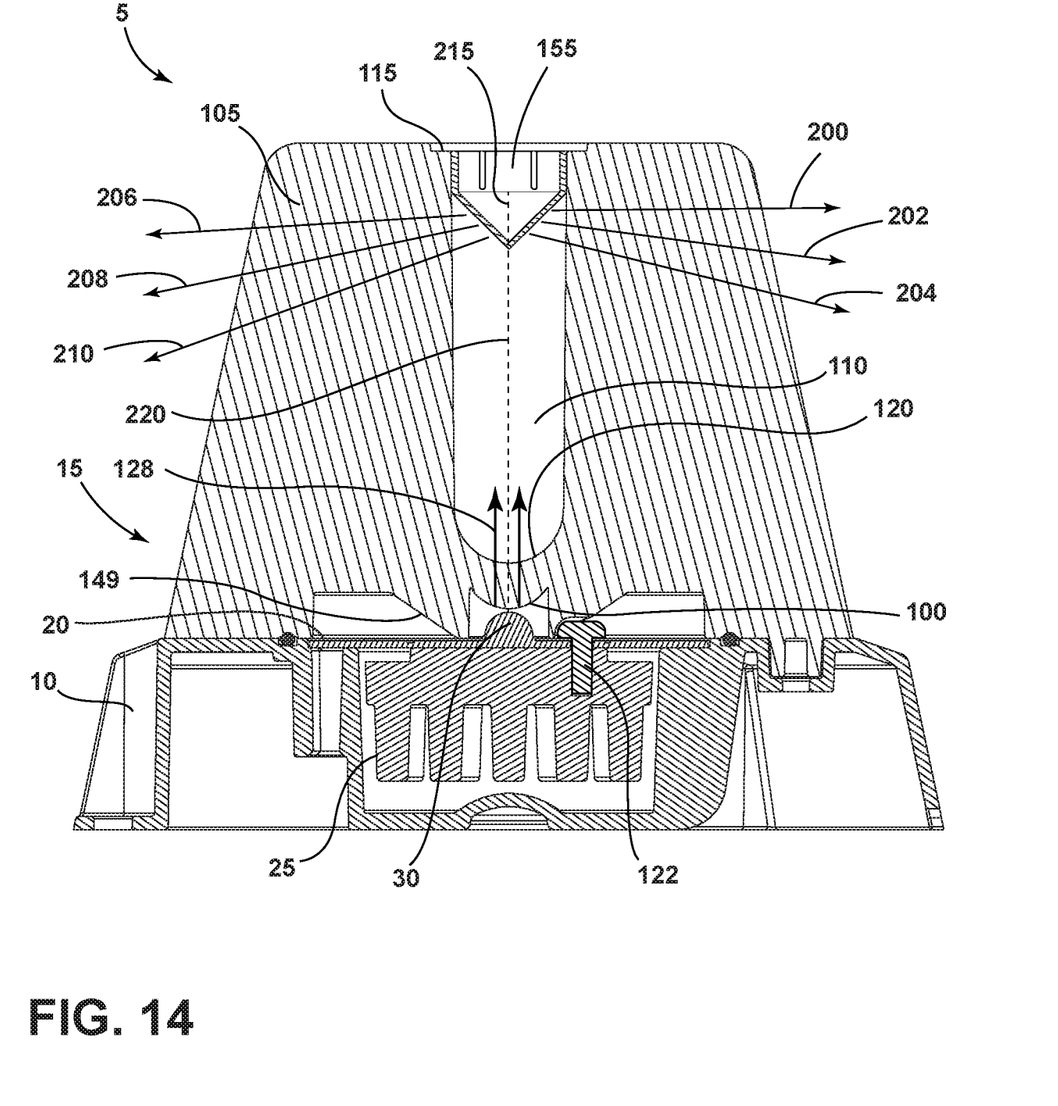
FIG. 14 is a section view of the LED signal light in FIG. 11 taken at line 14-14'.

The vertex 195 of the conical surface 175 is positioned in a direction axially pointing toward the LED light source 30, as illustrated in FIG. 14. The LED light source 30 emits light along an axial (or vertical) light emission axis 128 toward the light guide 15 and the conical reflecting component 155. The conical surface 175 reflects a portion of the light emitted by the LED light source 30 along substantially radial (or horizontal) light emission axes 200, 202, 204, 206, 208, and 210.

In some embodiments, the cone 160 is a right circular cone, and the cone 160 is positioned within the tube 110 such that a longitudinal axis 215 of the cone 160 is co-linear with a longitudinal axis 220 of the tube 110, as illustrated in FIG. 14. With this configuration, the conical surface 175 of the cone 160 is angled substantially 45 degrees relative to the axial light emission axis 128 of the LED light source 30 and reflects a large portion of the light emitted by the LED light source 30 along substantially radial (or horizontal) light emission axes 200, 202, 204, 206, 208, and 210.

Various features and advantages of the LED signal light 5 are set forth in the following claims.

What is claimed is:

1. An LED signal light comprising:
    a printed circuit board including
        a substrate layer, and
        a metal layer including
            a first pad sitting atop the substrate layer,
            a second pad sitting atop the substrate layer and spaced apart from the first pad in a radial direction to thermally isolate the second pad from the first pad, and
        two conductive paths electrically coupling the first pad and the second pad;
    an LED light source electrically coupled to the second pad; and
    electronic control circuitry electrically coupled to the first pad and configured to supply electrical energy to the LED light source.

2. The LED signal light of claim 1, wherein the metal layer includes a hole, and wherein the second pad is positioned within the hole.

3. The LED signal light of claim 1, further comprising a heat sink thermally coupled to the second pad.

4. The LED signal light of claim 1, wherein the printed circuit board is single sided.

5. The LED signal light of claim 1, wherein the electronic control circuitry supplies a current greater than 500 milliamps to the LED light source.

6. The LED signal light of claim 1, wherein the LED light source includes a plurality of LEDs facing one direction.

7. An LED signal light comprising:
    an LED light source configured to emit light along an axial light emission axis; and
    a light guide including
        a concave surface configured to reflect the light emitted from the LED light source along at least one substantially radial light emission axis, and
        a plurality of radially extending light transmission arms; and
    a conical reflecting component positioned within a hollow channel of the light guide, the conical reflecting component configured to reflect the light emitted from the LED light source toward the plurality of radially extending light transmission arms.

8. The LED signal light of claim 7, wherein the concave surface is a first concave surface, wherein the hollow channel extending from a top of the light guide toward the LED light source and terminating in a second concave surface.

9. The LED signal light of claim 8, wherein the plurality of radially extending light transmission arms extend around the hollow channel.

10. The LED signal light of claim 9, wherein the plurality of radially extending light transmission arms are substantially planar.

11. The LED signal light of claim 9, wherein the plurality of radially extending light transmission arms direct the light along a plurality of substantially radial light emission axes.

12. The LED signal light of claim 8, wherein the first concave surface is between the second concave surface and the LED light source.

13. The LED signal light of claim 7, wherein the concave surface is positioned axially relative to the LED light source.

14. The LED signal light of claim 7, wherein the plurality of radially extending light transmission arms emit the light along a plurality of substantially radial light emission axes.

15. An LED signal light comprising:
    a base;
    a printed circuit board on the base, the printed circuit board including
        a substrate layer, and
        a metal layer disposed adjacent to the substrate layer and including
            a first pad, and
            a second pad spaced apart from the first pad in a radial direction to thermally isolate the second pad from the first pad;

an LED light source electrically coupled to the second pad and configured to emit light along an axial light emission axis;

electronic control circuitry electrically coupled to the first pad and configured to supply electrical energy to the LED light source; and a light guide on the base, the light guide including
  a plurality of fins, and
  a concave surface configured to reflect the light emitted from the LED light source along at least one substantially radial light emission axis.

16. The LED signal light of claim 15, wherein the concave surface is a first concave surface, wherein the light guide further includes a tube extending from a top of the light guide and ending at a second concave surface.

17. The LED signal light of claim 16, wherein the plurality of fins radially extend away from the tube.

18. The LED signal light of claim 15, wherein the color temperature of the LED light source is between 5000 kelvins and 6500 kelvins.

19. The LED signal light of claim 15, wherein the LED light source includes a plurality of LEDs facing toward the concave surface.

20. The LED signal light of claim 15, wherein a portion of the light guide has a frustoconical shape and surrounds at least one selected from a group consisting of the LED light source and the concave surface.

21. The LED signal light of claim 16, further comprising a conical reflecting component positioned within the tube, the conical reflecting component configured to reflect the light emitted from the LED light source.

22. The LED signal light of claim 15, wherein the plurality of fins emit the light along the at least one substantially radial light emission axis.

* * * * *